United States Patent
Matsubara

(10) Patent No.: US 6,930,012 B2
(45) Date of Patent: Aug. 16, 2005

(54) SEMICONDUCTOR MEMORY WITH TRENCH CAPACITOR AND METHOD OF MANUFACTURING THE SAME

(75) Inventor: Yoshinori Matsubara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/876,591

(22) Filed: Jun. 28, 2004

(65) Prior Publication Data

US 2004/0262659 A1 Dec. 30, 2004

Related U.S. Application Data

(62) Division of application No. 10/178,742, filed on Jun. 25, 2002, now Pat. No. 6,787,837.

(30) Foreign Application Priority Data

Jun. 26, 2001 (JP) ..................................... 2001-193519

(51) Int. Cl.[7] .......................................... H01L 21/8242
(52) U.S. Cl. ...................... 438/392; 257/301; 257/347; 438/241; 438/246
(58) Field of Search ................................. 257/301, 347; 438/241, 246, 392

(56) References Cited

U.S. PATENT DOCUMENTS

| | | |
|---|---|---|
| 4,833,094 A | 5/1989 | Kenney |
| 5,014,887 A | 5/1991 | Kopp |
| 5,075,248 A | 12/1991 | Yoon et al. |
| 5,309,008 A | 5/1994 | Watanabe |
| 5,363,327 A | 11/1994 | Henkles et al. |
| 5,571,743 A * | 11/1996 | Henkels et al. ............. 438/241 |
| 5,618,751 A * | 4/1997 | Golden et al. .............. 438/392 |
| 5,770,484 A | 6/1998 | Kleinhenz |
| 6,001,684 A * | 12/1999 | Shen .......................... 438/246 |
| 6,472,702 B1 * | 10/2002 | Shen .......................... 257/301 |

* cited by examiner

*Primary Examiner*—David Nelms
*Assistant Examiner*—Dao H. Nguyen
(74) *Attorney, Agent, or Firm*—Oblon, Spivak, McClelland, Maier & Neustadt, P.C.

(57) ABSTRACT

A semiconductor memory device includes first and second semiconductor layers, a buried insulating layer, a trench comprising a retreated portion, and the trench defining a first opening width at the second semiconductor layer, a first capacitor electrode formed in the first semiconductor layer, a capacitor insulating film formed in the trench, a second capacitor electrode formed in the trench in the first semiconductor layer, an insulating film formed on a side surface of the retreated portion and defining second and third opening widths, the second opening width serving as a width at the buried insulating layer and being not more than the first opening width, and the third opening width serving as a width at a boundary portion between the buried insulating layer and first semiconductor layer, and a connection portion electrically connected to the second capacitor electrode.

19 Claims, 12 Drawing Sheets

SEMICONDUCTOR MEMORY WITH TRENCH CAPACITOR AND METHOD OF MANUFACTURING THE SAME

CROSS-REFERENCE TO RELATED APPLICATIONS

This application is upon and claims the benefit of priority from U.S. Ser. No. 10/178,742, filed Jun. 25, 2002 now U.S. Pat. No. 6,787,837, and from the prior Japanese Patent Application No. 2001-193519, filed Jun. 26, 2001, the entire contents of each are incorporated herein by reference.

BACKGROUND OF THE INVENTION

1. Field of the Invention

The present invention relates to a semiconductor memory device using an SOI (Silicon On Insulator) substrate and a method of manufacturing the same and, more particularly, to the structure of a trench capacitor.

2. Description of the Related Art

The integration degree of a semiconductor integrated circuit has been improved year by year, and in particular, the integration degree of a memory circuit makes remarkable progress. For example, since a DRAM (Dynamic Random Access-Memory) cell comprised of one transistor and one capacitor is required for an increase in integration degree and a decrease in manufacturing cost, an area occupied by components needs to be reduced. However, when the area and width of a resistive element need to be made smaller along with DRAM cell downsizing, it is difficult to maintain the electrical characteristics. To solve this, a trench capacitor capable of reducing the occupied area and maintaining the electrical characteristics is proposed.

FIGS. 32 to 38 are sectional views showing the steps in manufacturing a semiconductor memory device having a trench capacitor according to the prior art. A method of manufacturing the semiconductor memory device according to the prior art will be briefly described below.

As shown in FIG. 32, an SOI (Silicon On Insulator) substrate 111 is formed first. The SOI substrate 111 is formed from first and second semiconductor layers 111a and 111b and a buried layer 111c which is made of, e.g., an $SiO_2$ film and formed between the first and second semiconductor layers 111a and 111b. An $SiO_2$ film 112 is formed on the SOI substrate 111, and an SiN film 113 is formed on the $SiO_2$ film 112. A trench 117 is then formed to reach the first semiconductor layer 111a through the SiN film 113, $SiO_2$ film 112, second semiconductor layer 111b, and buried layer 111c.

An AsSG (Arsenic Silicate Glass) film 118 is formed on the inner side and bottom surfaces of the trench 117 and on the SiN film 113. The portion of the AsSG film 118 is removed by isotropic etching using a hydrofluoric acid solution. As in the AsSG film 118 is diffused into the first semiconductor layer 111a at the outer side surface of the trench 117 by high-temperature annealing. With this process, a plate diffusion layer 121a serving as a capacitor electrode is formed in the first semiconductor layer 111a along the side and bottom surfaces of the trench 117. The AsSG film 118 is then removed.

As shown in FIG. 33, a capacitor insulating layer 122 is formed on the inner side and bottom surfaces of the trench 117 and on the SiN film 113, and a polysilicon film 123 with As serving as a prospective capacitor electrode is formed on the capacitor insulating film 122. The polysilicon film 123 and capacitor insulating film 122 are removed so as to leave them inside the trench 117 in the first semiconductor layer 111a. With this process, a trench capacitor 127 formed from the plate diffusion layer 121a, capacitor insulating layer 122, and polysilicon film 123 is formed in the trench 117 in the first semiconductor layer 111a. A TEOS film 124 is then formed on the polysilicon film 123 and the side surface of the trench 117 at the second semiconductor layer 111b and buried layer 111c.

As shown in FIG. 34, a polysilicon film 126 containing As is formed in the trench 117 and on the SiN film 113.

As shown in FIG. 35, the polysilicon film 126 is removed by anisotropic etching such that its upper surface has a lower level than that of the second semiconductor layer 111b.

As shown in FIG. 36, the TEOS film 124 is removed by anisotropic etching such that its upper surface has lower level than that of the polysilicon film 126.

As shown in FIG. 37, a polysilicon film 140 containing As is formed in the trench 117 and on the SiN film 113.

As shown in FIG. 38, the polysilicon film 140 is removed by anisotropic etching such that its upper surface has a lower level than that of the second semiconductor layer 111b.

In this fashion, a transistor connection portion 128 formed from the polysilicon films 126 and 140 is formed and electrically connected to the trench capacitor 127.

In the prior art described above, when the AsSG film 118 is removed by isotropic etching using a hydrofluoric acid solution, the buried layer 111c and $SiO_2$ film 112 retreat in the lateral direction, thus undesirably forming recessed portions 130a and 130b, as shown in FIG. 32. With this structure, when the trench 117 is filled with the polysilicon film 126, a gap 141 is generated in the region in the trench 117 in which the recessed portion 130a is present, as shown in FIG. 34.

This causes a decrease in sectional area of the connection portion 128 serving as the current path between the capacitor 127 and a transistor (not shown). Therefore, since a parasitic resistance as the DRAM cell increases, the memory cannot realize high-speed read/write of an electrical signal as a DRAM element.

BRIEF SUMMARY OF THE INVENTION

A semiconductor memory device according to a first aspect of the present invention comprises a first semiconductor layer, a buried insulating layer formed on the first semiconductor layer, a second semi-conductor layer formed on the buried insulating layer, a trench formed to reach the first semiconductor layer through the second semiconductor layer and the buried insulating layer, the trench comprising a retreated portion at which a side surface of the buried insulating layer retreats with respect to a side surface of the second semiconductor layer, and the trench defining a first opening width at the second semiconductor layer, a first capacitor electrode formed in the first semiconductor layer along a side surface and a bottom surface of the trench, a capacitor insulating film formed in the trench to cover the first capacitor electrode, a second capacitor electrode formed in the trench in the first semiconductor layer to oppose the first capacitor electrode through the capacitor insulating film, an insulating film formed on a side surface of the retreated portion, the insulating film defining a second opening width and a third opening width, the second opening width serving as a width at the buried insulating layer, the second opening width being not more than the first opening width, and the third opening width serving as a width at a boundary portion between the buried insulating layer and first semiconductor layer, and a connection portion which is formed in the trench in the buried insulating layer and the second semiconductor layer and electrically connected to the second capacitor electrode.

A semiconductor memory device according to a second aspect of the present invention comprises a first semiconductor layer, a buried insulating layer formed on the first semiconductor layer, a second semiconductor layer formed on the buried insulating layer, a trench formed to reach the first semiconductor layer through the second semiconductor layer and the buried insulating layer, an insulating film formed on a side surface of the trench at a level lower than an upper surface of the second semiconductor layer, a first capacitor electrode formed on the insulating film and a bottom surface of the trench, a capacitor insulating film formed in the trench to cover the first capacitor electrode, a second capacitor electrode formed in the trench to oppose the first capacitor electrode through the capacitor insulating film, and a connection portion which is formed in the trench in the second semiconductor layer and electrically connected to the second capacitor electrode.

A method of manufacturing a semiconductor memory device according to a third aspect of the present invention comprises forming a substrate, the substrate comprising a buried insulating layer formed on a first semiconductor layer and a second semiconductor layer formed on the buried-insulating layer, forming a trench to reach the first semiconductor layer through the second semiconductor layer and the buried insulating layer, forming a first insulating film, which contains an impurity, on a side surface and a bottom surface of the trench, removing the first insulating film by isotropic etching on the side surface of the trench at the second semiconductor layer and the buried insulating layer, diffusing the impurity into the first semiconductor layer and forming a first capacitor electrode of a diffusion layer along the side surface and the bottom surface of the trench, removing the first insulating film, forming a capacitor insulating film on the side surface and the bottom surface of the trench in the first semiconductor layer, forming a second capacitor electrode on the capacitor insulating film, forming a second insulating film from the side surface of the trench at the buried insulating layer to a portion of an upper surface of the second capacitor electrode, and forming a connection portion in the trench in the second semiconductor layer and the buried insulating layer and electrically connecting the connection portion to the second capacitor electrode.

A method of manufacturing a semiconductor memory device according to a fourth aspect of the present invention comprises forming a substrate, the substrate comprising a buried insulating layer formed on a first semiconductor layer and a second semiconductor layer formed on the buried insulating layer, forming a trench to reach the first semiconductor layer through the second semiconductor layer and the buried insulating layer, forming an insulating film on a side surface of the trench, forming a first capacitor electrode on the insulating film and a bottom surface of the trench at a level lower than an upper surface of the second semiconductor layer, forming a capacitor insulating film on the first capacitor electrode and the insulating film, forming a second capacitor electrode on the capacitor insulating film in the trench, removing the second capacitor electrode, the capacitor insulating film, and the insulating film and exposing a portion of a side surface of the second semiconductor layer, and forming a connection portion in the trench in the second semiconductor layer and electrically connecting the connection portion to the second capacitor electrode.

DETAILED DESCRIPTION OF THE INVENTION

Figure 1:
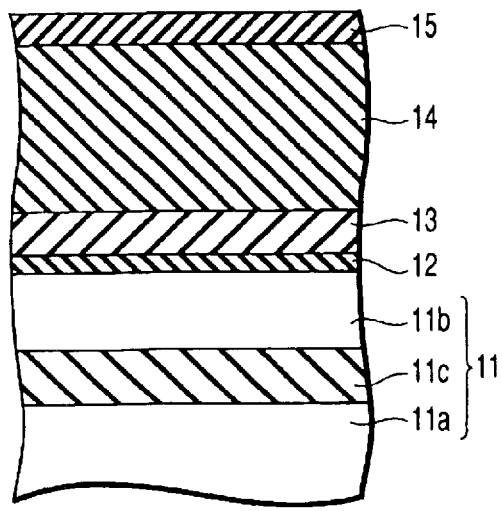
FIGS. 1, 2, 3, 4, 5, 6, 7, 8, 9, 10, 11, 12, 13, 14, 15, and 16 are sectional views showing the steps in manufacturing a semiconductor memory device according to the first embodiment of the present invention.

Embodiments of the present invention are related to, e.g., a DRAM (Dynamic Random Access Memory) cell comprised of one transistor and one capacitor and, more particularly, the structure of a trench capacitor using an SOI (Silicon On Insulator) substrate.

The embodiments of the present invention will be described below with reference to the accompanying drawings. In this description, the same reference numerals in all the drawings denote the same parts.

[First Embodiment]

In the first embodiment, the recessed portion of a buried layer is filled with an insulating film to make the side surface of a trench flat.

FIGS. 1 to 16 are sectional views showing the steps in manufacturing a semiconductor memory device according to the first embodiment of the present invention. The manufacturing method of the semiconductor memory device according to the first embodiment will be described below.

As shown in FIG. 1, an SOI substrate 11 is formed first. The SOI substrate 11 is formed from first and second semiconductor layers 11a and 11b and a buried layer 11c which is made of, e.g., an $SiO_2$ film and formed between the first and second semiconductor layers 11a and 11b. An $SiO_2$ film 12 with a thickness of, e.g., 30 to 200 Å is formed on the SOI substrate 11. An SiN film 13 with a thickness of, e.g., 1,500 to 2,500 Å is formed on the $SiO_2$ film 12. A BSG (Boron Silicate Glass) film 14 with a thickness of, e.g., 8,000 to 11,000 Å is formed on the SiN film 13. A TEOS (Tetra Ethyl Ortho Silicate) film 15 with a thickness of, e.g., 350 to 650 Å is formed on the BSG film 14.

Figure 2:
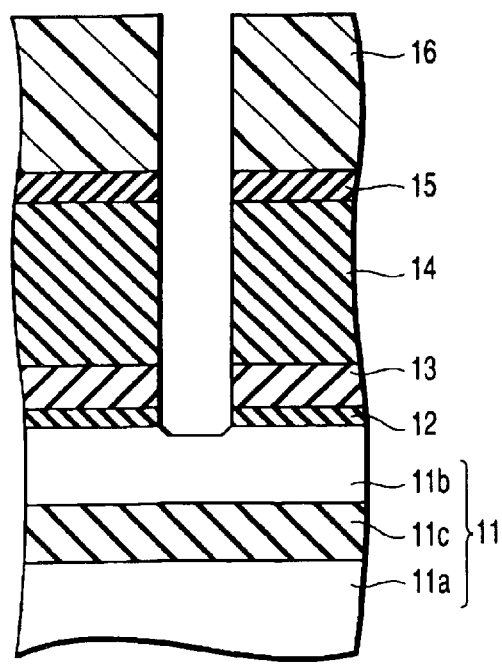

As shown in FIG. 2, a resist film 16 is applied to the TEOS film 15 and patterned. The TEOS film 15, BSG film 14, SiN film 13, and $SiO_2$ film 12 are removed by anisotropic etching by using the patterned resist film 16 as a mask. The patterned resist film 16 is then removed.

Figure 3:
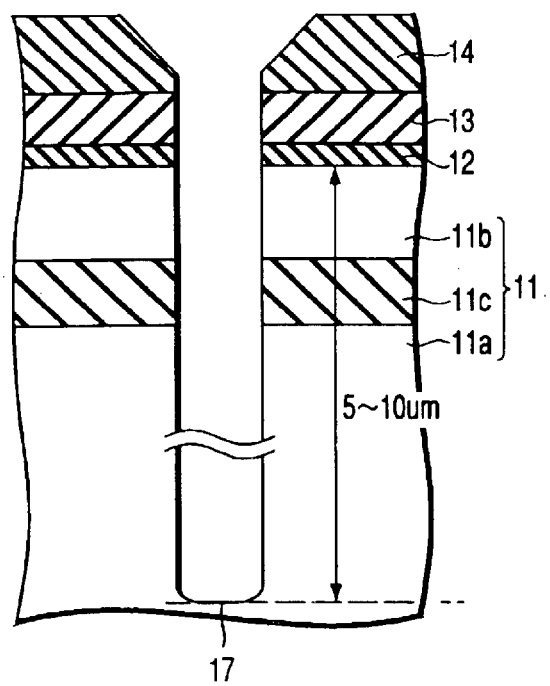

As shown in FIG. 3, the SOI substrate 11 is removed by anisotropic etching by using the BSG film 14 as a mask, so that a deep trench 17 is formed to reach the first semiconductor layer 11a through the second semiconductor layer 11b and buried layer 11c. The trench 17 has a depth of, e.g., 5 to 10 μm from the upper surface of the SOI substrate 11. When the trench 17 is to be formed, all the TEOS film 15 and a portion of the BSG film 14 are removed. After that, all the remaining BSG film 14 is removed and the SOI substrate 11 is cleaned.

Figure 4:
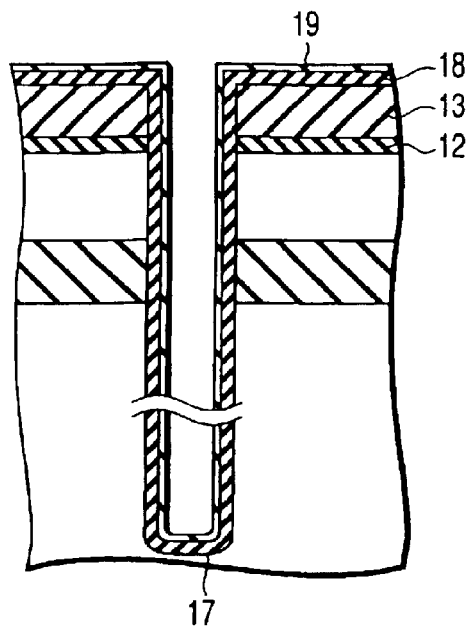

As shown in FIG. 4, an AsSG (Arsenic Silicate Glass) film 18 with a thickness of, e.g., 400 to 800 Å is formed on the inner side and bottom surfaces of the trench 17 and on the SiN film 13. The AsSG film 18 may be made of any insulating film containing an impurity and is desirably made of a film such as a PSG (Phosphorous Silicate Glass) film or $SiO_2$ film that is easily removed by a hydrofluoric acid solution. A TEOS film 19 with a thickness of, e.g., 200 to 300 Å is formed on the AsSG film 18.

Figure 5:
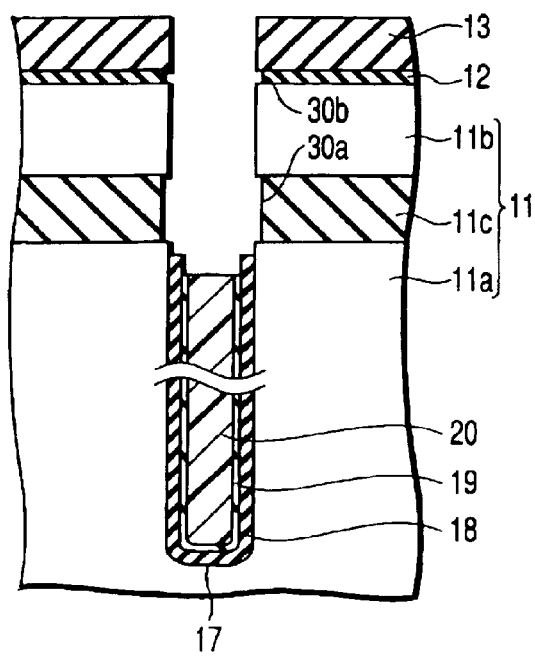

As shown in FIG. 5, a resist film 20 is formed on the TEOS film 19 and fills the trench 17. The resist film 20 is removed from the upper surface of the SOI substrate 11 by a depth of, e.g., 8,000 to 15,000 Å. With this process, the resist film 20 is left at a level lower than the lower surface of the buried layer 11c. A portion of the TEOS film 19 and a portion of the AsSG film 18 are then removed by isotropic etching using a hydrofluoric acid solution to leave them only at a level lower than the lower surface of the buried layer 11c. At this time, the buried layer 11c made of the $SiO_2$ film and $SiO_2$ film 12 retreat in the lateral direction, thus forming recessed portions 30a and 30b. Then, the resist film 20 is removed.

Figure 6:
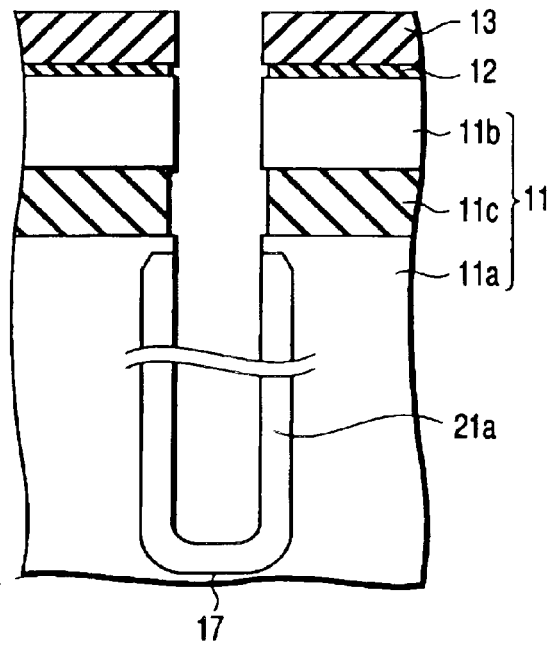

As shown in FIG. 6, As in the AsSG film 18 is diffused into the first semiconductor layer 11a at the outer side surface of the trench 17 by high-temperature annealing at 1,000° C. or more. With this process, a plate diffusion layer 21a serving as a capacitor electrode is formed in the first semiconductor layer 11a along the side and bottom surfaces of the trench 17. The AsSG film 18 and TEOS film 19 are then removed by using, e.g., a hydrofluoric acid solution, and the SOI substrate 11 is cleaned.

Figure 7:
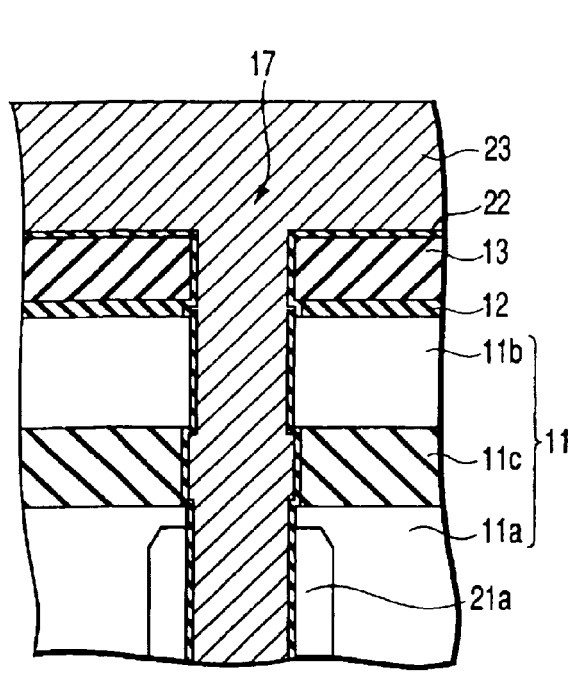

As shown in FIG. 7, the SOI substrate 11 is nitrided and then oxidized. With this process, a capacitor insulating film 22 made of a thin NO film is formed on the inner side and bottom surfaces of the trench 17 and on the SiN film 13. A polysilicon film 23 with As serving as a capacitor electrode is formed on the capacitor insulating film 22 and fills the trench 17. The polysilicon film 23 has a thickness of, e.g., 3,000 to 4,000 Å.

Figure 8:
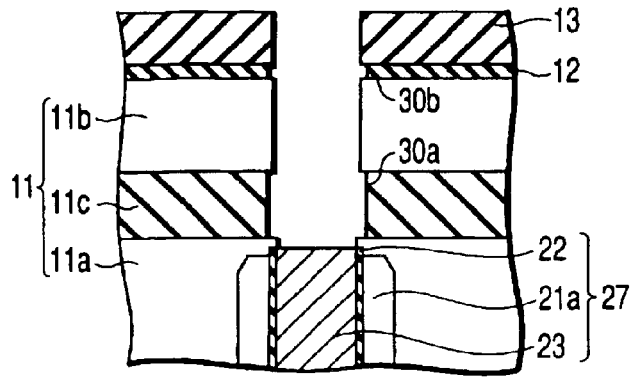

As shown in FIG. 8, the polysilicon film 23 and capacitor insulating film 22 are removed from the upper surface of the SOI substrate 11 by a depth of, e.g., 7,000 to 9,000 Å. With this process, the polysilicon film 23 and capacitor insulating film 22 are left only at a level lower than the lower surface of the buried layer 11c. The polysilicon film 23 and capacitor insulating film 22 left in the recessed portions 30a and 30b of the buried layer 11c and $SiO_2$ film 12 are removed by isotropic etching. In this fashion, a trench capacitor 27 formed from the plate diffusion layer 21a, capacitor insulating film 22, and polysilicon film 23 is formed.

Figure 9:
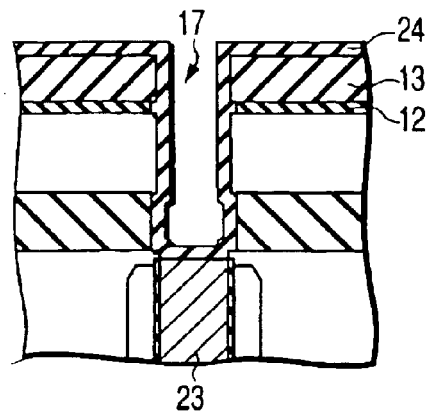

As shown in FIG. 9, a thick TEOS film 24 with a thickness of, e.g., 500 to 700 Å is formed on the SiN film 13, the inner side surface of the trench 17, and the polysilicon film 23.

Figure 10:
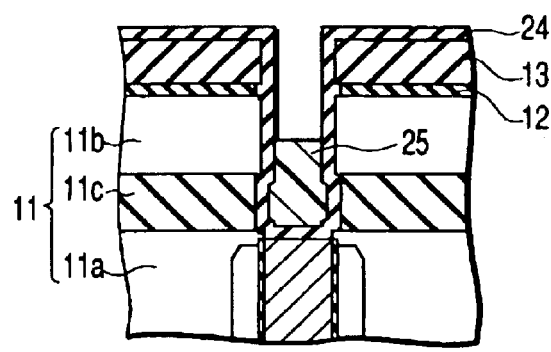

As shown in FIG. 10, a resist film 25 is applied to the TEOS film 24. After that, the resist film 25 is removed such that its upper surface has a lower level than the upper surface of the second semiconductor layer 11b and a higher level than the upper surface of the buried layer 11c.

Figure 11:
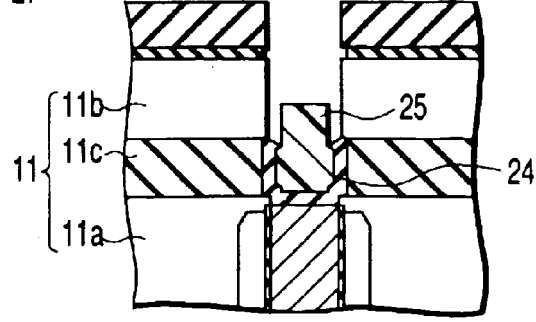

As shown in FIG. 11, the TEOS film 24 is removed by using the resist film 25 as a mask so as to be flush with the upper surface of the buried layer 11c. The TEOS film 24 is firstly removed by isotropic etching to be flush with the upper surface of the resist film 25 and then removed by anisotropic etching to be flush with the upper surface of the buried layer 11c.

Figure 12:
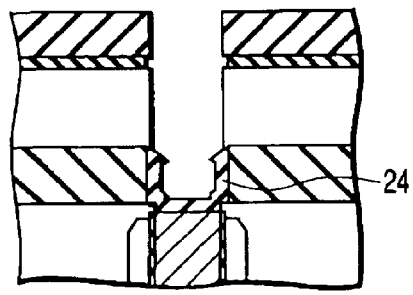

As shown in FIG. 12, the resist film 25 is then removed.

Figure 13:
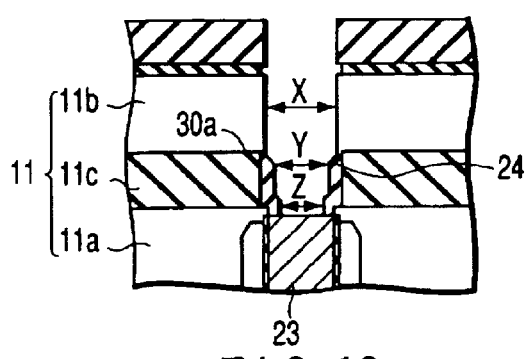

As shown in FIG. 13, the TEOS film 24 is etched by anisotropic etching. With this process, the TEOS film 24 at the portion in contact with the side surfaces of the buried layer 11c and first semiconductor layer 11a is left. The part of the TEOS film 24 at the portion in contact with the polysilicon film 23, and the TEOS film 24 at the boundary portion between the buried layer 11c and second semiconductor layer 11b are removed. Accordingly, the portion of the upper surface of the polysilicon film 23 is exposed, and the inner side surface of the trench 17 is made flat portion defined by the buried layer 11c. As a result, an opening width Y of the trench 17 in the buried layer 11c becomes smaller than an opening width X of the trench 17 in the second semiconductor layer 11b. Since the TEOS film 24 is left on the boundary portion between the buried layer 11c and first semiconductor layer 11a, an opening width Z of the trench 17 at that boundary portion becomes smaller than the opening width Y of the trench 17 in the buried layer 11c.

Figure 14:
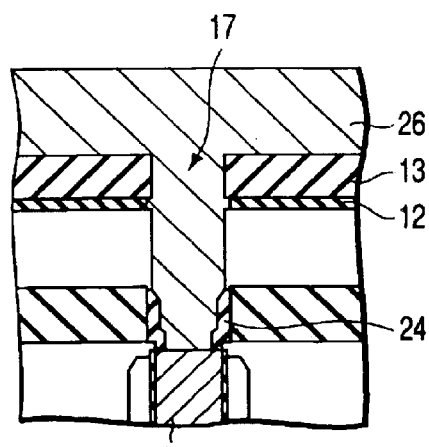

As shown in FIG. 14, a polysilicon film 26 containing As and having a thickness of, e.g., 3,500 to 4,500 Å is formed in the trench 17 and on the SiN film 13. With this process, the polysilicon film 26 is connected to the exposed upper surface of the polysilicon film 23.

Figure 15:
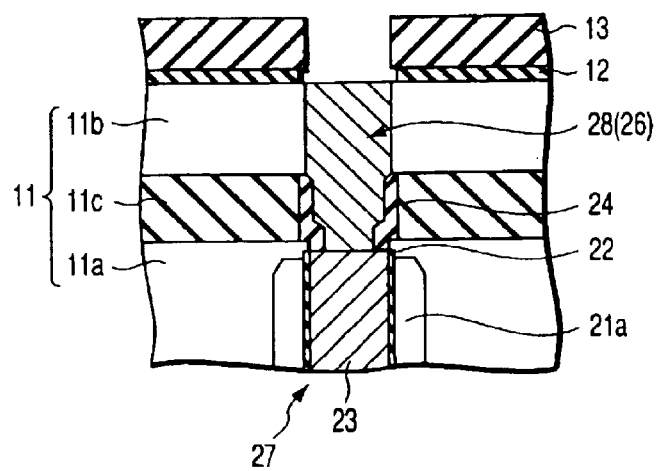

As shown in FIG. 15, the polysilicon film 26 is removed by anisotropic etching to be flush with the upper surface of the SOI substrate 11 and fills the trench 17 at the second semiconductor layer 11b. In this fashion, a transistor connection portion 28 made of the polysilicon film 26 is formed.

Figure 16:
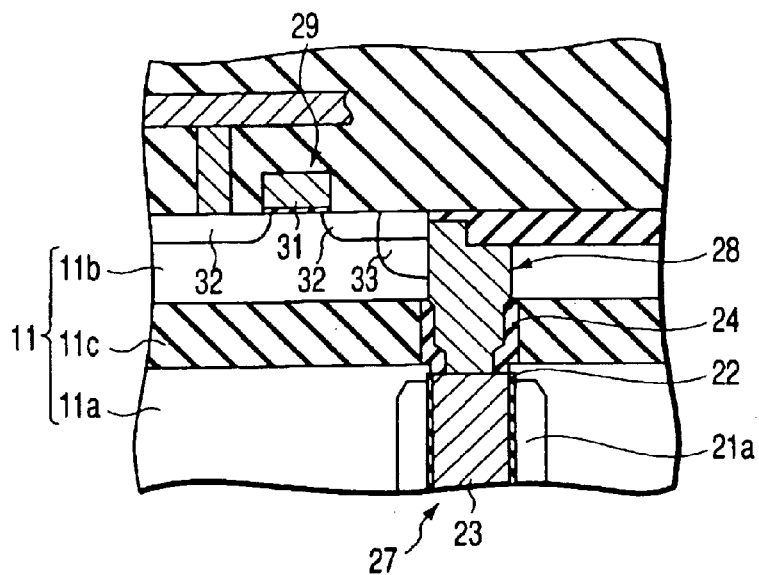

As shown in FIG. 16, a gate electrode 31, source/drain diffusion layers 32, and a diffusion layer 33 which is in contact with the source/drain diffusion layers 32 and transistor connection portion 28 are finally formed by using the well-known technique. With this process, a transistor 29 electrically connected to the trench capacitor 27 through the transistor connection portion 28 is formed.

According to the first embodiment described above, when the AsSG film 18 is removed by isotropic etching using a hydrofluoric acid solution, even if the buried layer 11c retreats in the lateral direction and the recessed portion 30 is then formed, the TEOS film 24 is formed in the recessed portion 30 to make the side surface of the trench 17 flat. The polysilicon film 26 can be suppressed to generate a gap therein when the trench 17 is filled with the polysilicon film 26. This can prevent a decrease in sectional area of the connection portion 28 serving as the current path between the capacitor 27 and transistor 29. Consequently, an increase in parasitic resistance as a DRAM cell can be suppressed, and the memory can realize high-speed read/write of an electrical signal as a DRAM element.

Figure 17:
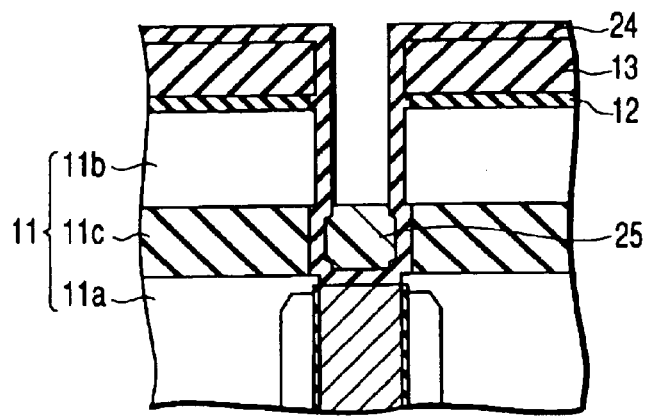
FIG. 17 is a sectional view showing the step in manufacturing another semiconductor memory device according to the first embodiment of the present invention.

Note that the method of removing the TEOS film 24 is not limited to that shown in FIGS. 11 and 12. For example, as shown in FIG. 17, the resist film 25 may be removed to be flush with the upper surface of the buried layer 11c, and the TEOS film 24 may be then removed by isotropic etching to be flush with the resist film 25 by using the resist film 25 as a mask.

Figure 18:
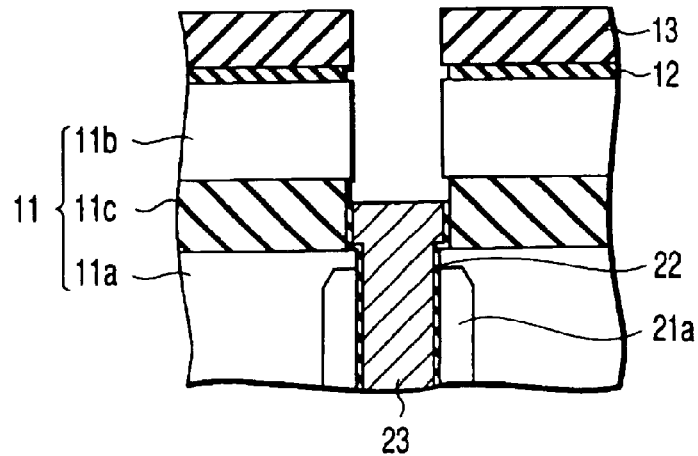
FIG. 18 is a sectional view showing the step in manufacturing a further semiconductor memory device according to the first embodiment of the present invention.
Figure 19:
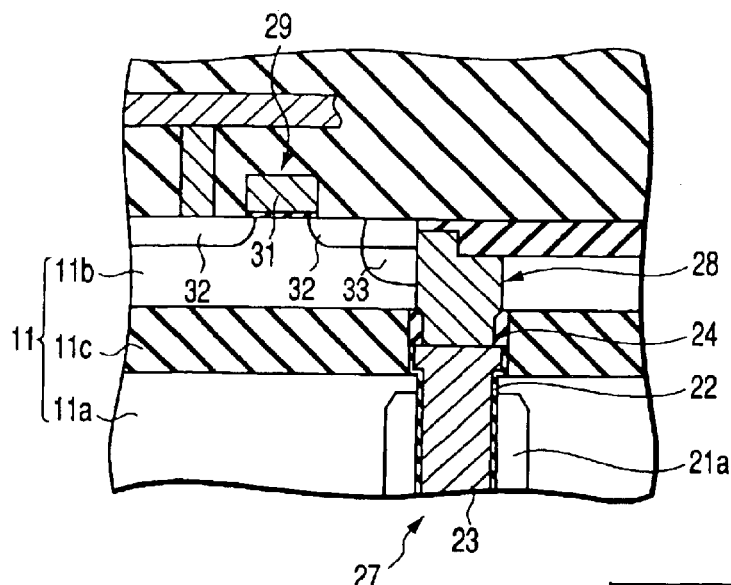
FIG. 19 is a sectional view showing the step in manufacturing the semiconductor memory device following FIG. 18 according to the first embodiment of the present invention.

The method of removing the polysilicon film 23 and capacitor insulating film 22 included in the trench capacitor 27 is not limited to that shown in FIG. 8. For example, as shown in FIGS. 18 and 19, the polysilicon film 23 and capacitor insulating film 22 may be left at a level higher than the lower surface of the buried layer 11c. That is, the polysilicon film 23 and capacitor insulating film 22 are not specifically limited as far as they are formed at a level lower than the upper surface of the buried layer 11c.

[Second Embodiment]

In the second embodiment, the process for retreating the buried layer in the lateral direction is eliminated, thus preventing a recessed portion from being formed in a buried layer.

FIGS. 20 to 31 are sectional views showing the steps in manufacturing a semiconductor memory device according to the second embodiment of the present invention. The manufacturing method of the semiconductor memory device according to the second embodiment of the present invention will be described below. In the manufacturing method of the semiconductor memory device according to the second embodiment, the same processes as in the first embodiment will be briefly described.

Figure 20:
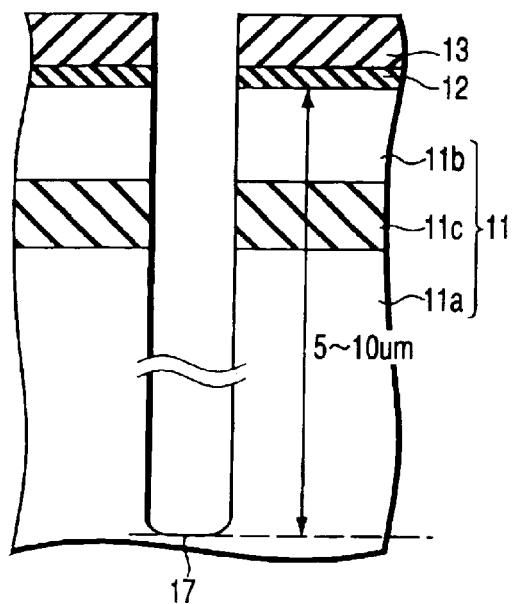

First, as in the first embodiment, a deep trench 17 having a depth of, e.g., 5 to 10 µm from an SOI substrate 11 is formed in the SOI substrate 11, as shown in FIG. 20.

Figure 21:
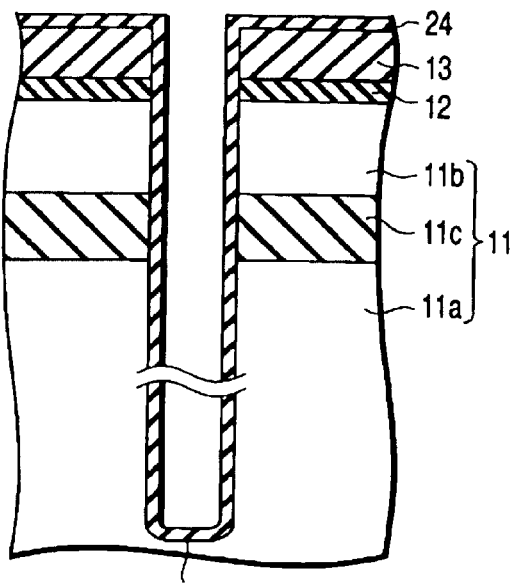
FIGS. 20, 21, 22, 23, 24, 25, 26, 27, 28, 29, 30, and 31 are sectional views showing the steps in manufacturing a semiconductor memory device according to the second embodiment of the present invention.

As shown in FIG. 21, a TEOS film 24 with a thickness of, e.g., 300 to 500 Å is formed on the inner side and bottom surfaces of the trench 17 and an SiN film 13.

Figure 22:
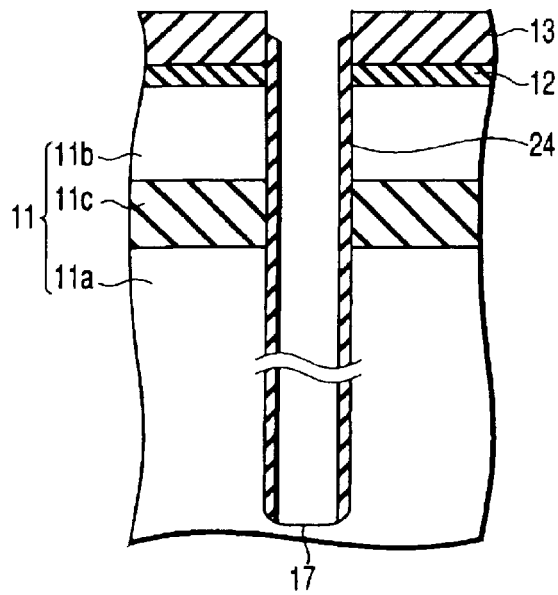

As shown in FIG. 22, the portions of the TEOS film 24 on the SiN film 13 and the bottom surface of the trench 17 are removed by anisotropic etching. Ions are implanted in the SOI substrate 11 at a high concentration to form a diffusion layer (not shown) along the bottom surface of the trench 17. The diffusion layer connects adjacent capacitors to each other.

Figure 23:
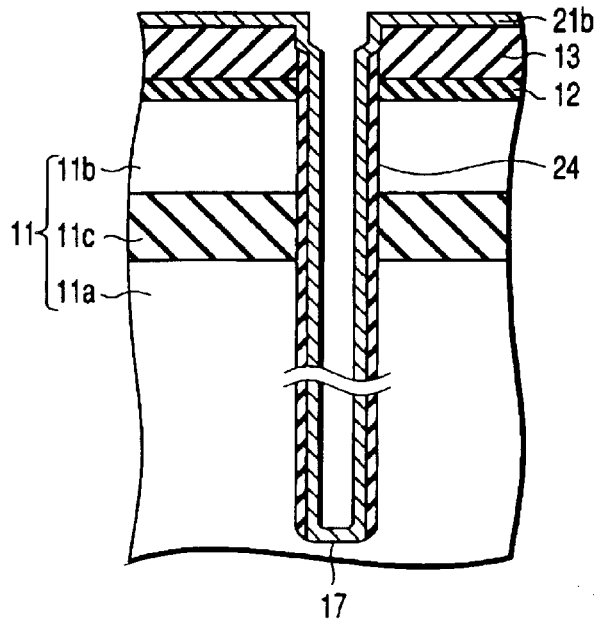

As shown in FIG. 23, a plate electrode film 21b made of a polysilicon film containing As is formed on the SiN film 13, TEOS film 24, and the bottom surface of the trench 17. The plate electrode film 21b serves as a capacitor electrode and has a thickness of, e.g., 200 to 500 Å.

Figure 24:
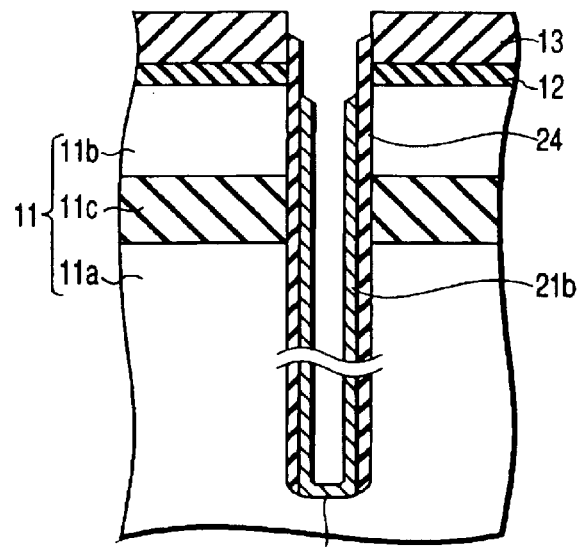

As shown in FIG. 24, a resist film (not shown) is formed in the trench 17. The plate electrode film 21b is removed by isotropic etching by using the resist film as a mask such that its upper surface has a lower level than the upper surface of the second semi-conductor layer 11b. After that, the resist film is removed and the SOI substrate 11 is cleaned.

Figure 25:
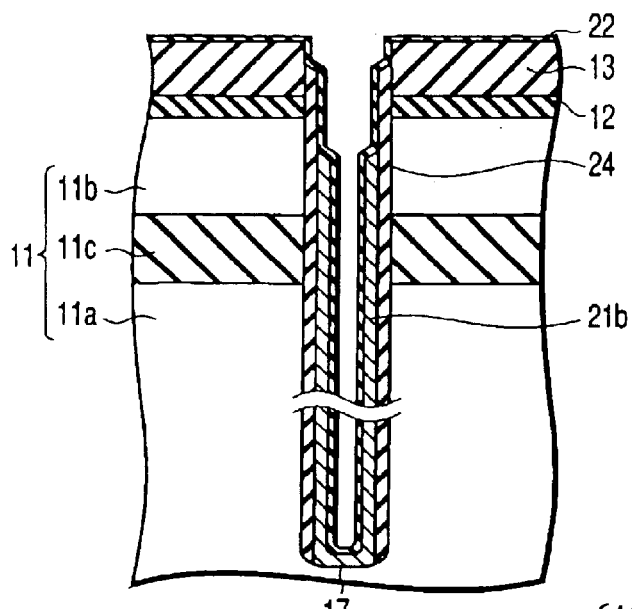

As shown in FIG. 25, the SOI substrate 11 is nitrided and then oxidized. With this process, a capacitor insulating film 22 made of a thin NO film is formed on the plate electrode film 21b, TEOS film 24, and SiN film 13.

Figure 26:
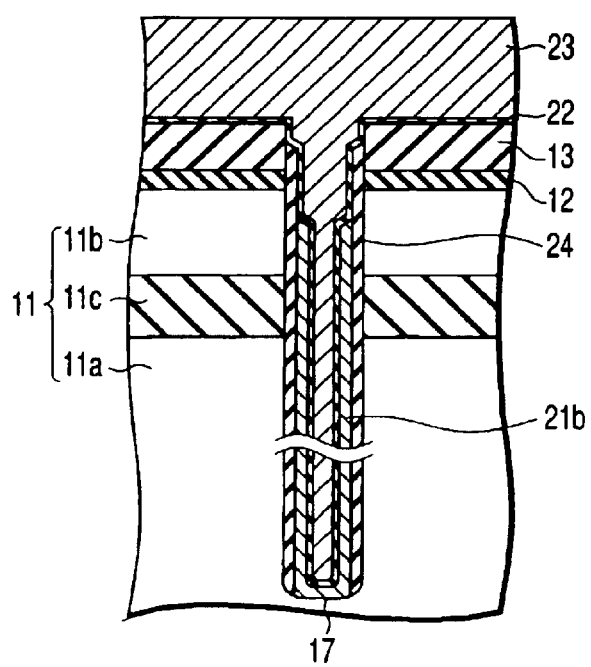

As shown in FIG. 26, a polysilicon film 23 with As serving as a capacitor electrode is formed on the capacitor insulating film 22 and fills the trench 17. The polysilicon film 23 has a thickness of, e.g., 3,000 to 4,000 Å.

Figure 27:
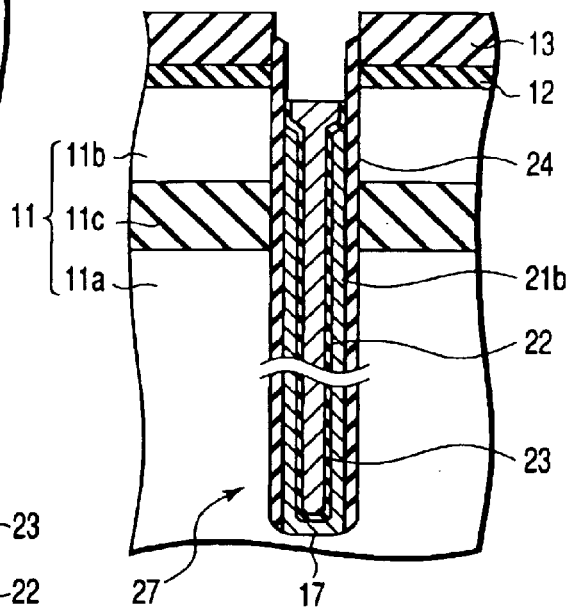

As shown in FIG. 27, the polysilicon film 23 and capacitor insulating film 22 are removed by anisotropic etching such that those upper surfaces have a lower level than the upper surface of the second semi-conductor layer 11b. In this fashion, a trench capacitor 27 formed from the plate electrode film 21b, capacitor insulating film 22, and polysilicon film 23 is formed.

Figure 28:
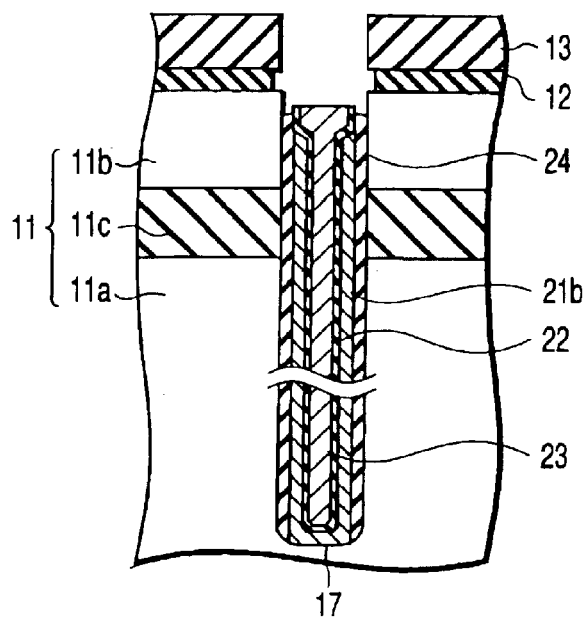

As shown in FIG. 28, the TEOS film 24 is removed by isotropic etching such that its upper surface has lower level than the upper surface of the second semiconductor layer 11b. With this process, the side surface of the trench 17 at the upper portion of the second semiconductor layer 11b is exposed.

Figure 29:
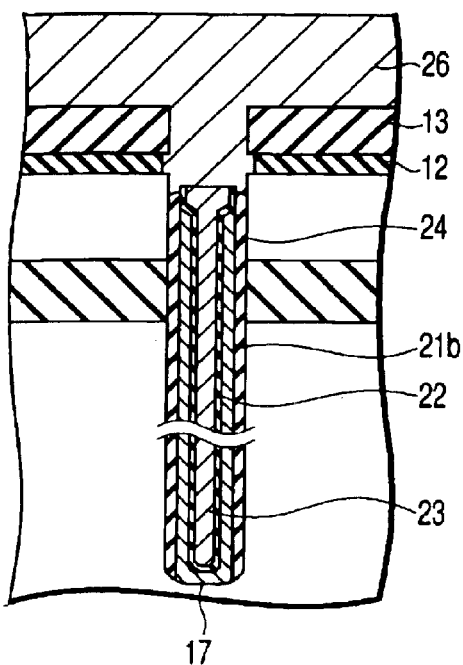

As shown in FIG. 29, a polysilicon film 26 containing As and having a film thickness of, e.g., 3,500 to 4,500 Å is formed in the trench 17 and on the SiN film 13. Thus, the polysilicon film 26 fills the trench 17 at the upper portion of the second semi-conductor layer 11b and is electrically connected to polysilicon film 23.

Figure 30:
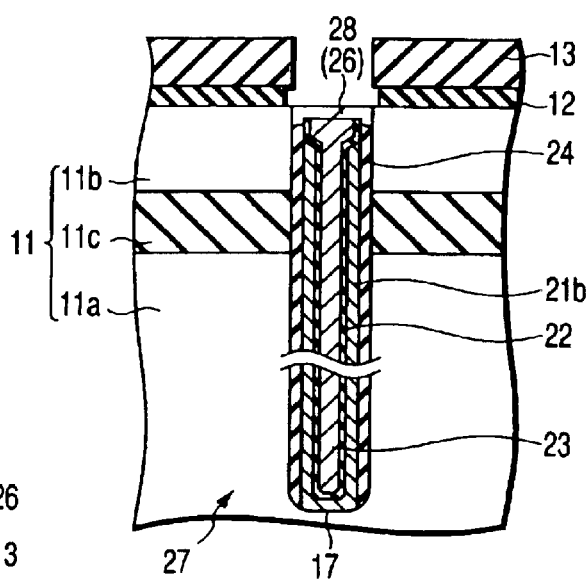

As shown in FIG. 30, the polysilicon film 26 is removed by anisotropic etching to be flush with the upper surface of the second semiconductor layer 11b. In this fashion, a transistor connection portion 28 made of the polysilicon film 26 is formed.

Figure 31:
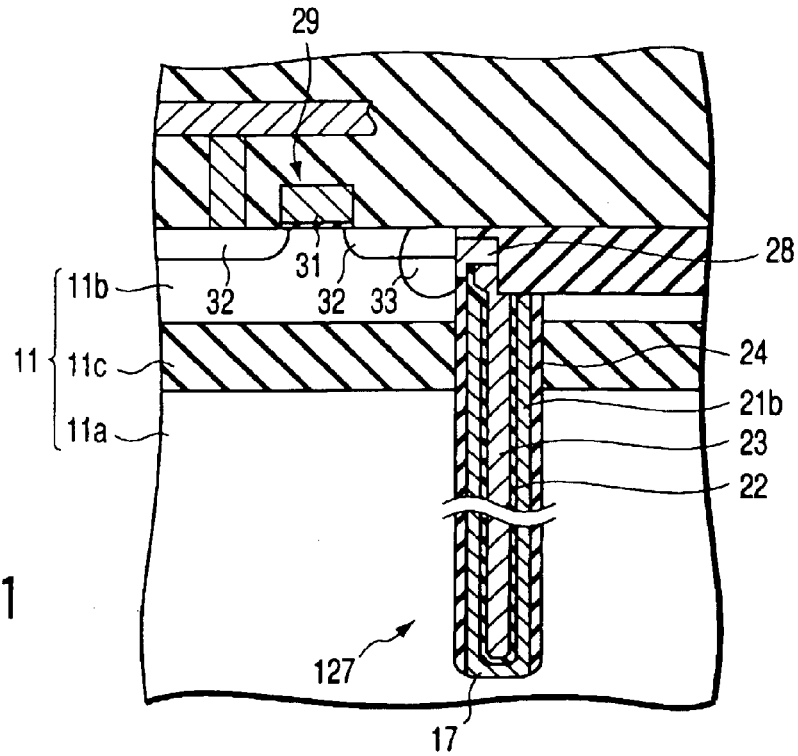
Figure 32:
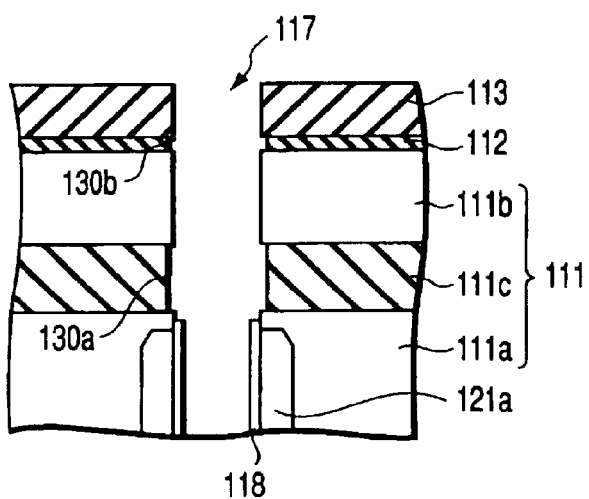
FIGS. 32, 33, 34, 35, 36, 37 and 38 are sectional views showing the steps in manufacturing a conventional semiconductor memory device.
Figure 33:
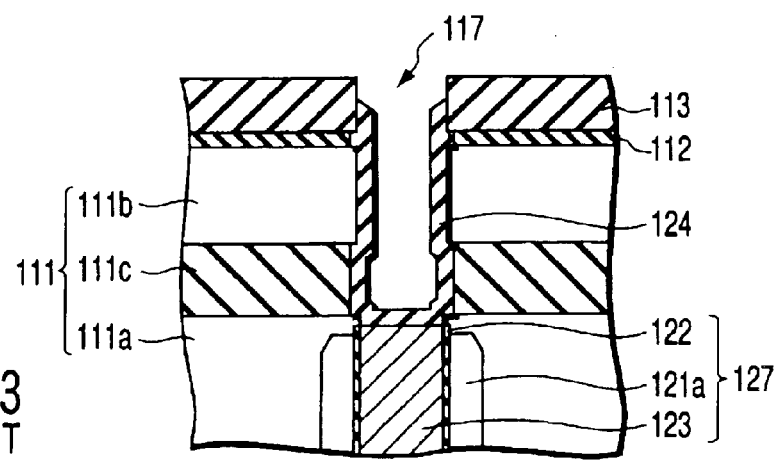
Figure 34:
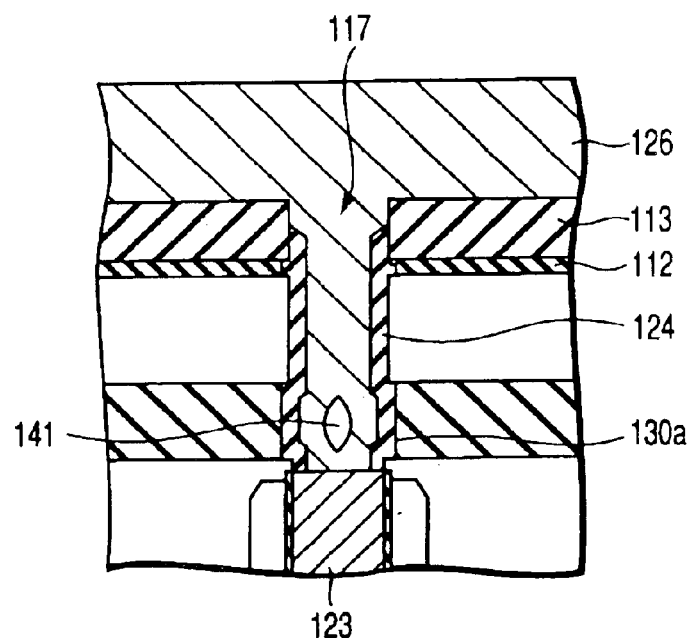
Figure 35:
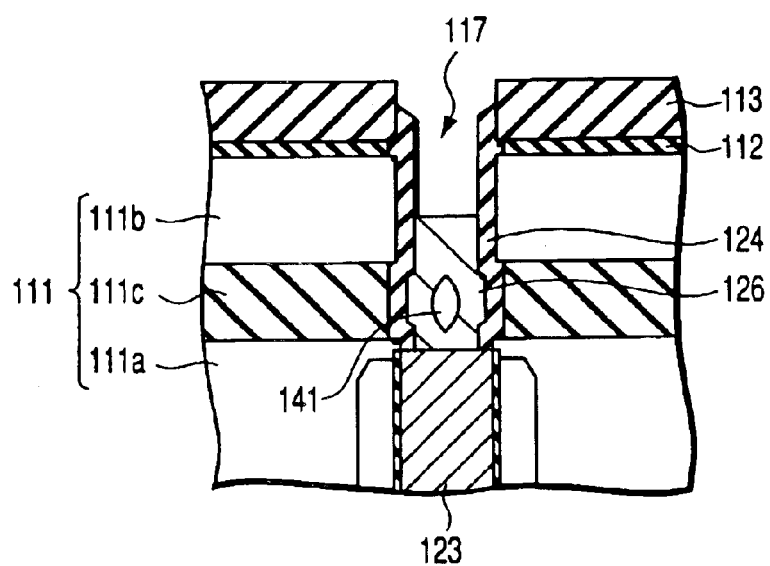
Figure 36:
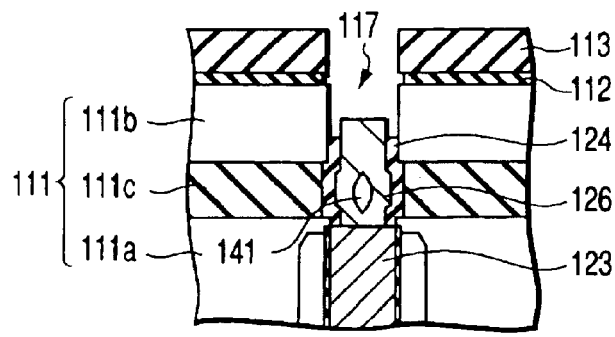
Figure 37:
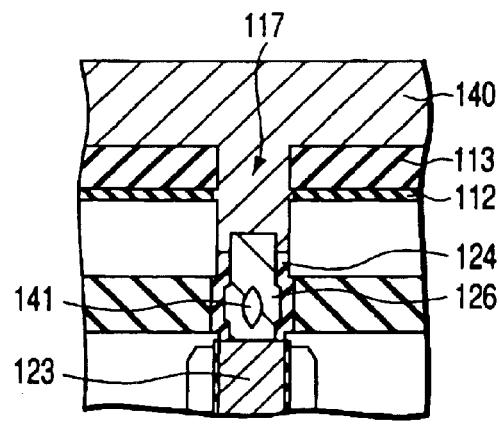
Figure 38:
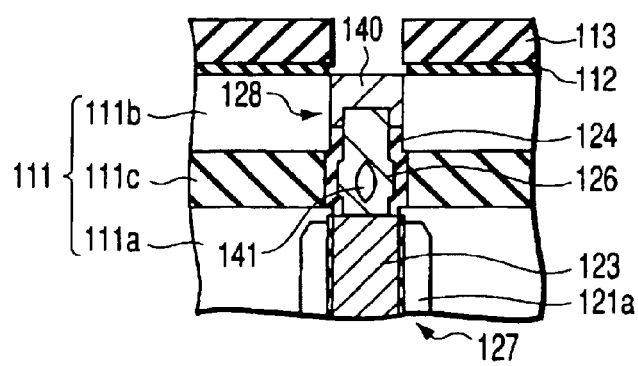

As shown in FIG. 31, a gate electrode 31, source/drain diffusion layers 32, and a diffusion layer 33 which is in contact with the source/drain diffusion layers 32 and transistor connection portion 28 are finally formed by using the well-known technique. With this process, a transistor 29 electrically connected to the capacitor 27 through the connection portion 28 is formed.

According to the second embodiment described above, in the process for forming the capacitor 27 in the trench 17, since the side surface of the buried layer 11c is not exposed, it does not retreat and a recessed portion 30 is not formed. Accordingly, no gap is generated in the polysilicon film 26 upon filling the trench 17 with it. This can prevent a decrease in sectional area of the connection portion 28 serving as the current path between the capacitor 27 and transistor 29. Consequently, an increase in parasitic resistance as a DRAM cell can be suppressed, and the memory can realize high-speed read/write of an electrical signal as a DRAM element.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A method of manufacturing a semiconductor memory device, comprising:

forming a substrate, the substrate comprising a buried insulating layer formed on a first semiconductor layer and a second semiconductor layer formed on the buried insulating layer;

forming a trench to reach the first semiconductor layer through the second semiconductor layer and the buried insulating layer;

forming a first insulating film, which contains an impurity, on a side surface and a bottom surface of the trench;

removing the first insulating film by isotropic etching on the side surface of the trench at the second semiconductor layer and the buried insulating layer;

diffusing the impurity into the first semiconductor layer and forming a first capacitor electrode of a diffusion layer along the side surface and the bottom surface of the trench;

removing the first insulating film;

forming a capacitor insulating film on the side surface and the bottom surface of the trench;

forming a second capacitor electrode on the capacitor insulating film;

removing the capacitor insulating film and the second capacitor electrode formed on side surfaces of the second semiconductor layer and the buried insulating layer;

forming a second insulating film on the side surface of the trench and the second capacitor electrode;

forming a resist film on the second insulating film inside the trench;

removing the second insulating film by using the resist film as a mask to be flush with an upper surface of the buried insulating layer;

removing the resist film;

removing a portion of the second insulating film on the second capacitor electrode, the second insulating film being in contact with the side surface of the buried insulating layer; and forming a connection portion in the trench in the second semiconductor layer and the buried insulating layer and electrically connecting the connection portion to the second capacitor electrode.

2. A method according to claim 1, wherein
after the second insulating film is removed by isotropic etching to be flush with an upper surface of the resist film, the second insulating film is removed by anisotropic etching to be flush with the upper surface of the buried insulating layer.

3. A method according to claim 1, wherein
after the resist film is formed to be flush with the upper surface of the buried insulating layer, the second insulating film is removed by anisotropic etching to be flush with the upper surface of the buried insulating layer.

4. A method according to claim 1, wherein
the capacitor insulating film and the second capacitor electrode are formed in the trench at a level lower than an upper surface of the buried insulating layer.

5. A method according to claim 1, further comprising
forming a diffusion layer in contact with the connection portion in the second semiconductor layer, and
forming a transistor electrically connected to the second capacitor electrode through the diffusion layer and the connection portion.

6. A method according to claim 1, wherein
the first insulating film comprises one of a PSG film and an SiO2 film.

7. A method according to claim 1, wherein
a second opening width of the trench at the second insulating film is not more than a first opening width of the trench at the second semiconductor layer.

8. A method according to claim 1, wherein
a third opening width of the trench at a boundary portion between the buried insulating layer and the first semiconductor layer is smaller than a second opening width of the trench at the second insulating film.

9. A method according to claim 1, wherein
the second insulating film defines a second opening width at the buried insulating layer,
the trench has a fourth opening width at a boundary between the buried insulating layer and the second semiconductor layer, and
the fourth opening width is greater than the second opening width.

10. A method according to claim 1, wherein
an inner side surface of the buried insulating layer is flat at a position where the second insulating film defines a second opening width.

11. A method according to claim 1, wherein
the second insulating film is lower in level than an upper surface of the buried insulating layer.

12. A method according to claim 1, wherein
the second insulating film is formed at positions other than a side wall of the second semiconductor layer.

13. A method according to claim 1, wherein
the trench has a first opening width at the second semiconductor layer and a fourth opening width at a boundary between the buried insulating layer and the second semiconductor layer, and
the fourth opening width is equal to the first opening width.

14. A method according to claim 1, wherein
in removing the first insulating film by isotropic etching, a depressed portion is formed at which a side surface of the buried insulating layer is depressed from a side surface of the second semiconductor layer.

15. A method according to claim 14, wherein
the second insulating film is formed at the depressed portion.

16. A method of manufacturing a semiconductor memory device, comprising:
forming a substrate, the substrate comprising a buried insulating layer formed on a first semiconductor layer and a second semiconductor layer formed on the buried insulating layer;
forming a trench to reach the first semiconductor layer through the second semiconductor layer and the buried insulating layer;
forming an insulating film on a side surface of the trench;
forming a first capacitor electrode on the insulating film and a bottom surface of the trench at a level lower than an upper surface of the second semiconductor layer;
forming a capacitor insulating film on the first capacitor electrode and the insulating film;
forming a second capacitor electrode on the capacitor insulating film in the trench;
removing the second capacitor electrode, the capacitor insulating film, and the insulating film and exposing a portion of a side surface of the second semiconductor layer; and
forming a connection portion in the trench in the second semiconductor layer and electrically connecting the connection portion to the second capacitor electrode, the connection portion being in contact with the portion of the side surface of the second semiconductor layer.

17. A method according to claim 16, further comprising
forming a diffusion layer in contact with the connection portion in the second semiconductor layer, and
forming a transistor electrically connected to the second capacitor electrode through the diffusion layer and the connection portion.

18. A method according to claim 16, further comprising
after forming the second capacitor electrode,
removing the second capacitor electrode and the capacitor insulating film by anisotropic etching and locating an upper surface of the second capacitor electrode and an upper surface of the capacitor insulating film at a level lower than the upper surface of the second semiconductor layer, and
removing the insulating film by isotropic etching and locating an upper surface of the insulating film at a level lower than the upper surface of the second semiconductor layer.

19. A method according to claim 16, wherein
the insulating film is removed by isotropic etching in exposing the portion of the side surface of the second semiconductor layer.

* * * * *